United States Patent [19]

Schilling

[11] Patent Number: 4,697,042
[45] Date of Patent: Sep. 29, 1987

[54] SOLAR GENERATOR

[75] Inventor: Roland Schilling, Gemmingen, Fed. Rep. of Germany

[73] Assignee: Telefunken Electronic GmbH, Heilbronn, Fed. Rep. of Germany

[21] Appl. No.: 889,343

[22] Filed: Jul. 25, 1986

[30] Foreign Application Priority Data

Jul. 27, 1985 [DE] Fed. Rep. of Germany ....... 3527001

[51] Int. Cl.[4] .................. H02N 6/00; H01L 25/02
[52] U.S. Cl. .................. 136/244; 136/251; 136/256
[58] Field of Search .................. 136/244, 251, 256

[56] References Cited

U.S. PATENT DOCUMENTS 3,459,597  8/1969  Baron .................................. 136/244
3,769,091 10/1973  Leinkram et al. .................. 136/246
4,233,085 11/1980  Roderick et al. .................... 136/244

FOREIGN PATENT DOCUMENTS 59-198779  3/1985  Japan .................................. 136/251

Primary Examiner—Aaron Weisstuch
Attorney, Agent, or Firm—Spencer & Frank

[57] ABSTRACT

The invention relates to a solar generator comprising separate and spaced semiconductor solar cells having surfaces provided for light incidence and electrically interconnected connection contacts for the surfaces and opposite rear faces, and having separate surface coverings for the various solar cells. The surface coverings here are so designed that the spaces between adjacent solar cells in which the connection contacts are located are each covered by a bridge.

7 Claims, 4 Drawing Figures

SOLAR GENERATOR

BACKGROUND OF THE INVENTION

The invention relates to a solar generator, comprising separate and spaced semiconductor solar cells having surfaces provided for light incidence and electrically interconnected connection contacts for the surfaces and opposite rear faces, and having separate surface coverings for the various solar cells.

Solar generators comprise individual and interconnected solar cells which can be connected in parallel or in series using connection contacts. The solar cells thus connected are hermetically encapsulated using suitable covering materials, e.g. glass.

On account of the relatively large temperature fluctuations encountered in use, it is essential for space solar cells and generators that the encapsulation between adjacent solar cells not be hermetic in the area of the electrical connection contacts, to take account of the various temperature coefficients with regards to expansion. For this reason, the electrical connection contacts are designed elastically deformable in these areas.

It has now become clear that it is particularly the high atomic oxygen content in a preferred flight altitude that causes the destruction of electrical connection contacts, which are, for example, made of silver.

SUMMARY OF THE INVENTION

The object underlying the invention is to provide a structure for a solar generator that guarantees longer life for space solar generators.

This object is attained in accordance with the present invention by designing the surface coverings so that the spaces between adjacent solar cells, inside which the connection contacts run, are each covered by a bridge.

Further advantageous embodiments of the invention can be found in the sub-claims.

The solar generator according to the invention has the substantial advantage that materials already qualified in space applications, such as cover glass and cover glass adhesive, can be used for its manufacture.

Embodiments of the invention are shown in the Figures and described in detail in the following:

DESCRIPTION OF THE PREFERRED EMBODIMENTS

Figure 1A:
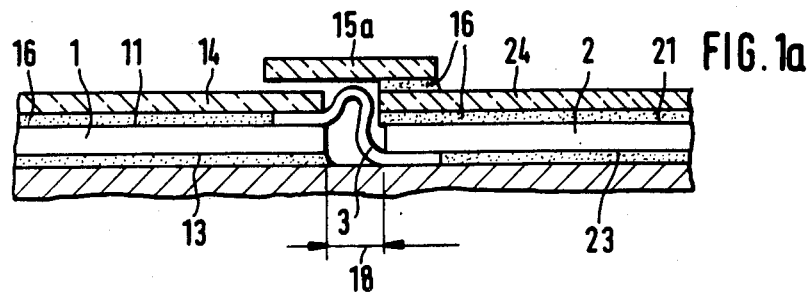
FIG. 1a shows the structure of a solar generator having a bridge 15a designed as a separate element.

The solar generator structure shown in FIG. 1a shows two separate, doped semiconductor elements 1 and 2. A connection contact 3 is arranged on the surfaces 11 and 21 facing the light incidence, said contact being as a rule designed finger-shaped on surfaces 11 and 21 and serving to connect up the various solar cells into suitable solar modules using the appropriate rear face contacts 13 and 23. The connection shown in FIG. 1a is of the series type, but as a general principle parallel connections using connection contact 3 are also possible, since the part of the connection contact located in the connecting area of two directly adjacent solar cells is elastically deformable. A covering material 14 or 24, which is preferably of glass and which covers connection contact 3 with a bridge 15a attached to said material across the space 18 between adjacent solar cells, is provided on surfaces 11 and 21, respectively, to protect said surfaces from harmful effects which can destroy the connection contact, such as atomic oxygen in high concentration, for example.

The surface coverings 14 and 24 and bridge 15a are affixed to the various solar cells and to one another by a cover glass adhesive 16.

Figure 1B:
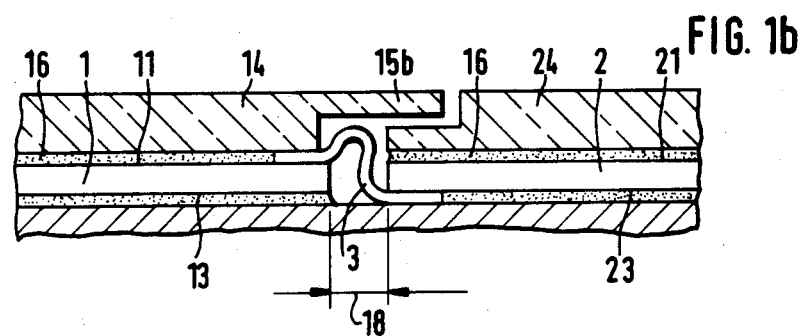
FIG. 1b shows the structure of a solar generator having a bridge 15b in the plane of the surface covering.

The solar generator structure shown in FIG. 1b represents a modification of the solar generator shown in FIG. 1a. In particular, bridge 15b across space 18 is designed homogeneous with the surface covering 14 and horizontal in one plane. All other elements are identical to those shown in FIG. 1a.

Figure 1C:
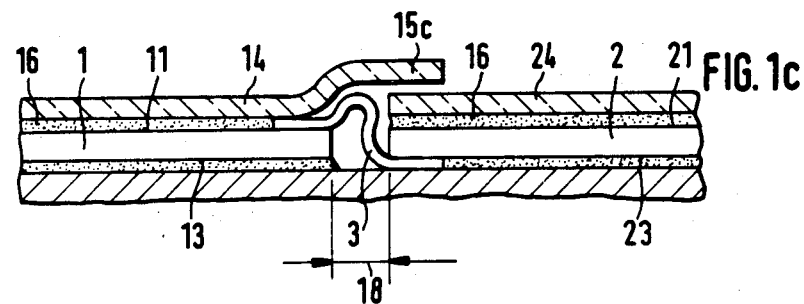
FIG. 1c shows the structure of a solar generator having an S-shaped bridge 15c.

FIG. 1c shows the structure of a solar cell in which the bridge 15c across space 18 is designed higher than the surface covering 14 and is of S-shaped configuration.

Figure 1D:
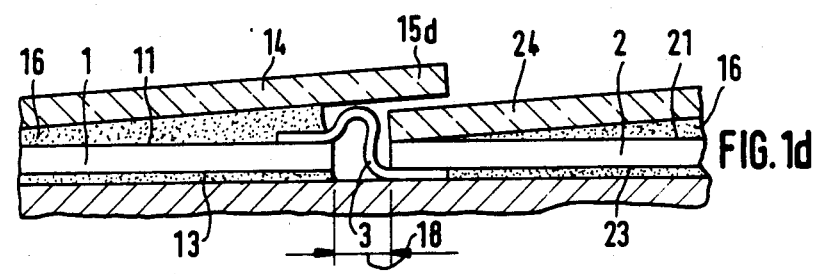
FIG. 1d shows the structure of a solar generator having a ramp-shaped bridge 15d.

FIG. 1d shows a further modification of the bridge embodiment, the bridge here being designed integral with the surface coverings 14 or 24 and being applied to the cover glass adhesive 16, which here has a wedge-shaped cross-section, so that surface coverings 14, 24 together with their bridges 15d overlap like scales.

A two-pack silicone-based adhesive can be used as cover glass adhesive 16, and is commercially available under the name of silicone rubber.

What is claimed is:

1. A solar generator for use in space comprising separate and spaced semiconductor solar cells (1, 2) having surfaces (11, 21) provided for light incidence and electrically interconnected, elastically deformable connection contacts (3) for the light incidence surfaces and for the opposite rear faces (13 and 23), with each solar cell having a separate surface covering, wherein the surface coverings (14, 24) are so designed that the spaces (18) between adjacent solar cells, in which the connection contacts (3) are located, are each covered by a bridge (15) connected solely to, and supported solely by, a respective surface covering.

2. A solar generator according to claim 1, wherein the bridge is arranged as a separate element (15a) on the surface covering (14, 24).

3. A solar generator according to claim 1, wherein the bridge (15b, c, d) is designed homogeneous with the surface covering (14, 24).

4. A solar generator according to claim 1, wherein the cover material (14, 24) is of glass.

5. A solar generator according to claim 1, wherein the bridge (15b) is on the same plane as the surface covering (14, 24).

6. A solar generator according to claim 1, wherein the bridge is designed as an S-shaped tongue (15c).

7. A solar generator according to claim 1, wherein the bridge is a ramp (15d) covering a portion of an adjacent solar cell.

* * * * *